United States Patent [19]

Englisch et al.

[11] Patent Number: 5,736,206
[45] Date of Patent: Apr. 7, 1998

[54] MOLDED BODY OF QUARTZ GLASS AND PROCESS FOR THE PRODUCTION OF A MOLDED BODY OF QUARTZ GLASS

[75] Inventors: Wolfgang Englisch, Kelkheim; Stephan Moritz, Erlensee; Dietmar Hellmann, Linsengericht, all of Germany

[73] Assignee: Heraeus Quarzglas GmbH, Hanau, Germany

[21] Appl. No.: 640,759

[22] PCT Filed: Nov. 10, 1994

[86] PCT No.: PCT/EP94/03722

§ 371 Date: May 7, 1996

§ 102(e) Date: May 7, 1996

[87] PCT Pub. No.: WO95/13248

PCT Pub. Date: May 18, 1995

[30] Foreign Application Priority Data

Nov. 12, 1993 [DE] Germany .............. 43 38 807.8

[51] Int. Cl.⁶ .............. C03B 19/06; C03B 20/00; B01J 3/00; H01L 21/02
[52] U.S. Cl. .............. 428/34.6; 428/43.4; 428/426; 65/17.2; 65/17.3
[58] Field of Search .............. 428/426, 428, 428/34.4, 34.6; 65/17.2, 17.3

[56] References Cited

U.S. PATENT DOCUMENTS

| | | |
|---|---|---|
| 3,837,825 | 9/1974 | Loxley et al. .............. 65/18 |
| 3,882,901 | 5/1975 | Seiler et al. .............. 428/34.6 X |
| 4,956,208 | 9/1990 | Uchikawa et al. .............. 428/34.4 X |
| 5,330,941 | 7/1994 | Yaba et al. .............. 428/426 X |
| 5,389,582 | 2/1995 | Loxley et al. .............. 65/17.3 X |

FOREIGN PATENT DOCUMENTS

| | | |
|---|---|---|
| 0475549 | 3/1992 | European Pat. Off. . |
| 543957 | 1/1932 | Germany . |
| 58-12280 | 1/1983 | Japan . |

*Primary Examiner*—Daniel Zirker
*Attorney, Agent, or Firm*—Felfe & Lynch

[57] ABSTRACT

Molded bodies of quartz glass have at least one surface area of transparent quartz glass, the exposed surfaces of which are smooth and which have a surface microroughness of less than 8 μm. The base material has a chemical purity of at least 99.9% and a cristobalite content of no more than 1%; is gas-impermeable and opaque; and contains pores. At a wall thickness of 1 mm, the base material has a nearly uniform direct spectral transmission of less than 10% in the wavelength range of $\lambda=190-2,650$ nm; and which has a density of at least 2.215 g/cm³. The transparent surface area is formed from base material by heating it to a temperature above 1,650° C. The thickness of the transparent layer is at least 0.5 mm, and its direct spectral transmission in the wavelength range of $\lambda=6001-2,650$ nm is at least 60% for a layer thickness of 1 mm.

22 Claims, 3 Drawing Sheets

MOLDED BODY OF QUARTZ GLASS AND PROCESS FOR THE PRODUCTION OF A MOLDED BODY OF QUARTZ GLASS

BACKGROUND OF THE INVENTION

The invention pertains to a molded body of quartz glass which has at least one surface region of transparent quartz glass, the exposed surface of which is smooth, with a surface microroughness of less than 8 μm.

The invention also pertains to a process for the production of a molded body of quartz glass with at least one surface region of transparent quartz glass, the surface of which is smooth, with a surface microroughness of less than 8 μm.

Japanese Registered Design Publication No. 58-12280 (published on Jan. 26, 1983) describes a molded body of quartz glass which has at least one surface region of transparent quartz glass, the exposed surface of which is smooth and has a surface roughness of less than 2 μm. A flange ring of transparent quartz glass is fused onto the flange of a base consisting of opaque, bubble-containing quartz glass; the exposed surface of the ring is polished again to achieve the desired low surface roughness and then flame-glazed to produce a smooth surface. It is extremely expensive to produce a molded body with a structure of this kind, because each flange ring must be cut individually from a transparent quartz glass plate, which entails a considerable amount of cutting waste in addition to other problems. Fusing a transparent quartz glass flange ring of this kind onto a flange of opaque quartz glass, furthermore, is extremely risky because of the possibility of shrinkage and/or the development of internal stresses between the two grades of quartz glass. Aside from this, the production method is also highly labor-intensive. Nor does the flame-glazing of the exposed surface of the flange of the molded body of opaque quartz glass lead to the desired result, because, although a smooth surface resistant to acid treatment is obtained, the bubbles of the quartz glass remain behind as holes of considerable size in the exposed surface.

SUMMARY OF THE INVENTION

The invention is based on the task of creating a molded body of quartz glass of the type characterized above which has a simple structure, which can be produced inexpensively, and which eliminates the need to stock or to produce supplemental components.

The invention is based on the additional task of offering a process for the production of these molded bodies which can be implemented easily and which eliminates almost all of the material waste.

The molded body includes a base, the base material of which has a chemical purity of at least 99.9% and a cristobalite content of no more than 1%, which is gas-impermeable and opaque and contains pores. At which, a wall thickness of 1 mm, the base material has nearly constant direct spectral transmission of less than 10% in the wavelength range of $\lambda=190$ nm to $\lambda=2,650$ nm; and a density of at least 2.15 g/cm$^3$. The transparent surface region is formed from the base material by subjecting it to a heat treatment at a temperature of more than 1,650° C., the thickness of the transparent layer being at least 0.5 mm, the direct spectral transmission of the transparent layer being at least 60% in the wavelength range of $\lambda=600$ nm to $\lambda=2,650$ nm for a layer thickness of 1 mm.

It is advantageous for the molded body to consist of a single base.

Preferably at least 80% of the pores of the base material have a maximum pore dimension of less than 20 μm; it is advantageous for the maximum pore dimension to be less than 10 μm. The pore content of the base material is in the range of 0.5–2.5% per unit volume.

Because the molded body is formed from a base consisting of a base material with specified characteristics, stresses are almost completely eliminated, because the density of the opaque, porous base material and the density of the base material made transparent by the heat treatment do not differ essentially from each other. Because of the low percentage of pores per unit volume in the base material, the base material which has been transformed into transparent material also fails to show any significant amount of shrinkage. Many of the other technical properties of the transparent layer are also nearly identical to those of the base material.

As stated above, the direct spectral transmission in the wavelength range of $\lambda=600-2,650$ nm should have a value of at least 60% for a layer thickness of 1 mm. The spectral transmission, i.e., the transparency of the base material in the transparent surface region, is measured by means of a spectrophotometer without the Ulbricht (integrating) sphere on the basis of a suitably prepared test piece with polished surfaces. The percentage transmission value calculated for a layer thickness of approximately 0.5 mm on the basis of the value stated above and the coefficient of extinction will be proportionately higher.

A base is produced according to the invention by the slip casting method, where quartz glass with a purity of at least 99.9% is ground up into a powder with a particle size of less than 70 μm, and a slip is formed from the powder and stabilized over the course of 1–240 hours by being kept in continuous motion. The stabilized slip is cast into a porous mold corresponding to the base and allowed to remain there for a certain period of time. The base blank is then removed from the mold, dried, heated in a furnace at a heating rate of 5–60 K/min to a sintering temperature in the range of 1,350°–1,450° C., and exposed to a temperature of more than 1,300° C. for a period of at least 40 minutes. The sintered base is then cooled, and a surface region of the opaque, porous, gas-impermeable base material forming the base is then heated locally by means of a heat source to a temperature in the range of 1,650°–2,200° C. to transform the porous, opaque base material into transparent quartz glass until the thickness of the transparent surface region is at least 0.5 mm and its direct spectral transmission has a value of at least 60% in the wavelength range of $\lambda=600-2,650$ nm for a layer thickness of 1 mm. Because the low spectral transmission of the base material of the base effectively suppresses the transport of energy by thermal radiation, the input of heat has the effect of heating only a thin layer of the surface region at first, although this happens very quickly. Because thermal conduction through the base material is also slow, the heat-affected zone remains locally limited, and high temperatures in the range of 1,650°–2,200° C. are quickly reached. As this is being done, the micropores in the base material sinter together, and a layer of transparent quartz glass forms. Because the density of the porous, opaque base material is nearly the same as the density of the solid, transparent quartz glass, i.e., the volume fraction of the micropores in the base material is very low, no significant shrinkage occurs and internal stresses in the base are avoided. Outside the heat-treated surface region, the properties of the opaque, porous base material remained unchanged.

A particular advantage of the process according to the invention is that it can be used to produce molded bodies of any desired complicated shape with at least one transparent surface region. This advantage is attributable to the use of the slip-casting method to produce the base of the molded body and to the local heating of the desired surface region of the base to transform the base material from its opaque, porous state to the transparent state.

It is advantageous for the transparent surface region of the molded body according to the invention to form the face of a flange. The thickness of the transparent surface region in this case should be more than 0.6 mm. This molded body can be produced more cheaply than the state of the art as known from the Japanese registered design. Only a single material is used in the invention, namely, the special base material. The smooth surface, which can also be polished if desired, results in a good sealing effect. It is possible to clean the exposed surface of the transparent surface region by etching it with hydrofluoric acid, for example, without fear that this process will impair the sealing action of the exposed surface.

In another embodiment of the invention, the molded body can be designed as a hollow component, where at least parts of its exterior and/or interior surface form the transparent surface region. It can be advantageous in this case for the entire exterior and/or interior surface to be transparent. A hollow component of this type can be, for example, a pipe, the exterior and/or interior surfaces of which are transparent. In the case of pipes such as those used as high-temperature pressing rolls or smoothing rolls, for example, the exterior surface of the tubular base would be made transparent. In the case of pipes used to conduct highly heated, chemically aggressive substances, the interior surface of the tubular base would be made transparent. The exterior surface remaining opaque would prevent direct thermal radiation, whereas the transparent interior surface would reduce the corrosion caused by the substances and prevent the adhesion of particles.

The molded body can also be designed in the form of a crucible, where advantageously its entire interior surface would be transparent over a layer thickness of, for example, 1.5 mm. Leaving the exterior surface of the crucible opaque ensures a homogeneous temperature distribution in the crucible, whereas the transparent interior surface is less susceptible to corrosion than an opaque, porous interior surface would be and can also be cleaned more easily.

The molded body can also be, for example, a component of a container, and the transparent surface region which is made transparent over its entire thickness can serve as a viewing window. It is very easy to produce a viewing window of this kind according to the invention, whereas, in contrast, the previously conventional practice of fusing a window into a container is an extremely delicate and complicated process, which is possible only at the cost of subjecting a relatively large area of the container to thermal stress.

In the same way that a viewing window is formed, a surface region of any of the molded bodies in question can be made transparent over the entire thickness of the base. For this purpose, it has been found effective to supply heat to each of the opposing surface regions by means of separate heat sources to bring about the transformation of the opaque, porous, quartz glass into transparent quartz glass.

In another, preferred, embodiment, the molded body according to the invention is designed as a component of a mirror blank, such as a light-weight mirror blank; in this case, the transparent surface region forms the surface of the mirror blank to be provided with a reflective coating. First, a base in the form of a mirror blank or of a component of a mirror blank is produced by means of the slip casting process described above. Next, the surface of the mirror blank or of the component which is to be provided with a reflective coating is heated by means of one or more heat sources. The surface to be heated and the heat source(s) are moved with respect to each other, so that gradually the entire surface is heated and the base material is transformed into the transparent state. This procedure for producing a molding body as a mirror blank is much less expensive than the assembly of a mirror blank known according to the state of the art by fusing, fritting, or sintering several individual components together and then possibly by subjecting the resulting assembly to some form of mechanical processing.

BRIEF DESCRIPTION OF THE DRAWINGS

Preferred exemplary embodiments of molded bodies according to the invention are explained in greater detail below on the basis of the drawings:

FIG. 4C shows a section of a pipe with a wall which is transparent all the way through;

DETAILED DESCRIPTION OF THE PREFERRED EMBODIMENTS

Figure 1:
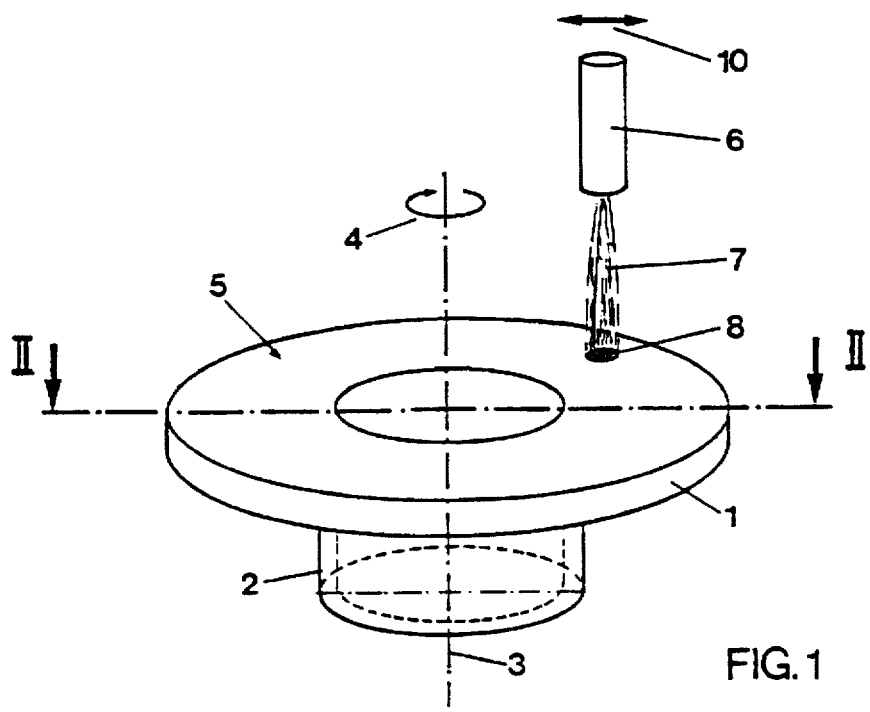
FIG. 1 shows the production of a transparent layer on the surface of a flange.

All of the bases for the individual parts shown in FIGS. 1–6 are made by the slip casting method. The starting material for this process is highly pure, amorphous silicon dioxide with a chemical purity of 99.9%, which is produced from quartz sand or rock crystal. It is also possible, if desired, to use highly pure quartz waste materials such as broken quartz glass as the starting material.

The starting material is ground in a powder with a particle size of less than 70 µm, preferably in a very narrow range between 0.45 and 50 µm. This grinding process is carried out together with demineralized water in a ball mill lined with polyurethane. To keep the starting material chemically pure, the grinding balls which are used preferably consist of quartz glass. The slip is kept in motion in the ball mill until there are no longer any observable sedimentation phenomena. In this state, the solids content of the slip is approximately 80% at a pH of 4.5. Then the slip is poured into a hard plaster mold, which represents a negative mold for the base to be obtained. After the cast material has been held in its entirety in the mold for several hours, the crude molded blank is removed from the mold and dried. This drying process should proceed under mild conditions such as under slow, gradual heating to a temperature of 300° C., during which the individual temperature stages are maintained for periods of time on the order of 10–15 hours. The temperature should be elevated in steps of approximately 15°–20° C. This dried, molded blank is then subjected to a high-temperature treatment in a furnace, for which a sintering temperature of 1,350°–1,450° C. is used. The molded blank is subjected to the high-temperature treatment at over 1,300° C. for at least 40 minutes. Then the sintered blank is cooled. The base is now opaque and porous. It is evident that such bases can be produced in any desired shape by means of the simple slip-casting process described above. Even complicated structures are possible; the limits of such structures will be determined by the casting molds to be produced and by the possibility of removing the shape from the mold. Under certain conditions, lost-plaster molds can be used; that is, the plaster mold is destroyed after the starting material has dried.

This process for the production of the base is now followed by a local temperature treatment in the range of 1,650°–2,200° C. to transform the porous, opaque base material into transparent quartz glass. For this purpose the base material is heated until a transparent surface layer at least 0.5 mm thick is produced. Local heating is carried out with a heat source, preferably a gas torch such as a natural gas or oxyhydrogen torch, a plasma torch, an electric arc, or a laser such as a $CO_2$ laser. As is evident, different heat sources can be used to heat the base locally in different ways, e.g., either to pro- duce a 2-dimensional area or to produce a highly defined heating pattern such as through the use of a laser beam. The process of creating the transparent surface layer leaves behind a surface of extreme smoothness on the microscopic scale.

Figure 2:
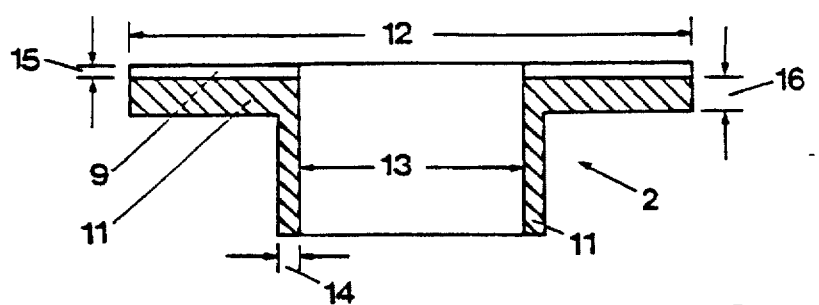
FIG. 2 shows a cross section along line II—II of FIG. 1.

FIG. 1 shows a flange 1, which carries a stiffening web 2 on the bottom, also produced by the casting process. This base is produced by the casting process described above. The base is clamped in a turning device and rotated around axis 3 in the direction of rotational arrow 4. Flame 7 of an oxyhydrogen torch 6 is directed onto exposed surface 5 of flange 1. This flame heats a local area 8 of surface 5. To heat the entire exposed surface of the flange and thus to produce a transparent surface layer 9, as indicated in FIG. 2, not only is flange 1 rotated around axis of rotation 3 but also torch 6 is moved back and forth in the direction of double-arrow 10 in the radial direction of the surface of the flange. A motion in the direction of double arrow 10 can proceed from the inside out or from the outside in; under certain conditions, however, a kind of oscillating motion can be implemented so that the individual surface areas are treated several times by flame 7 of torch 6.

As the cross-sectional view in FIG. 2 shows, only one transparent surface layer 9 is produced in the illustrated embodiment, whereas the bottom surface of flange 1 and web 2 remain as opaque base material 11.

The flange illustrated in FIGS. 1 and 2 has an outside diameter 12 of 280 mm and an inside diameter 13 of 200 mm. Thickness 14 of tubular web 2 is approximately 4 mm. The vitrified, transparent surface layer 9 is made with a thickness 15 of 3 mm in the illustrated embodiment, whereas the remaining opaque surface layer 11 on the bottom of the flange remains with corresponding thickness 16 of 12 mm.

It can be seen that the component in the form of a flange with a web 2 can be provided with a transparent surface layer 9 on the top surface of the flange, but also that, by means of a corresponding modification of the process, other areas of the component as well, e.g., the bottom surface of the flange or even the inside periphery of tubular web 2, can also be made transparent.

Figure 3:
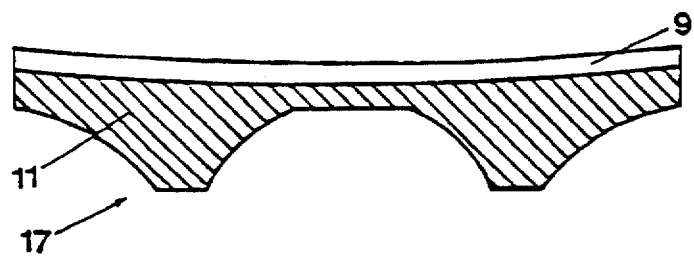
FIG. 3 shows a longitudinal cross section through a light-weight mirror blank.

FIG. 3 shows a mirror support blank 17, which is structured on its bottom surface and which has a transparent surface layer 9 on its top surface. This transparent layer has been produced in accordance with the process of the invention, that is, by means of a torch assembly like that shown in FIG. 1. Especially in conjunction with mirror support elements, it is possible by means of the casting process according to the invention and the subsequent formation of a transparent layer 9 to build up very complicated and finely detailed support structures. As a result of the process used to create transparent layer 9, an extremely smooth and nonporous layer is obtained, onto which, after mechanical processing, a reflective coating can then be applied by, for example, vapor deposition.

Figure 4A:
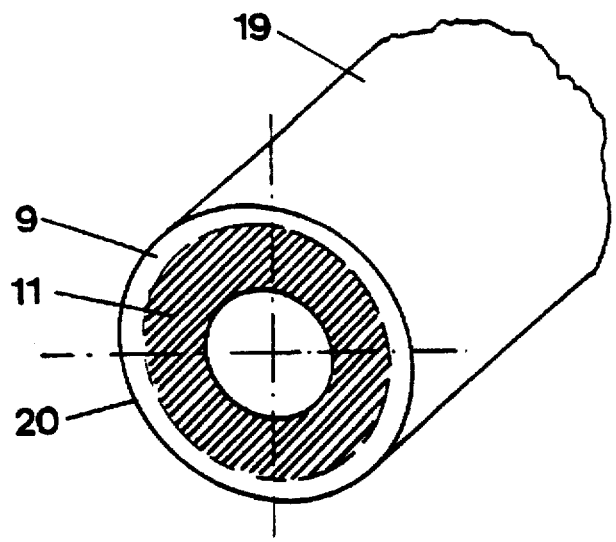
FIG. 4A shows a section of a pipe with a transparent outer layer.
Figure 4B:
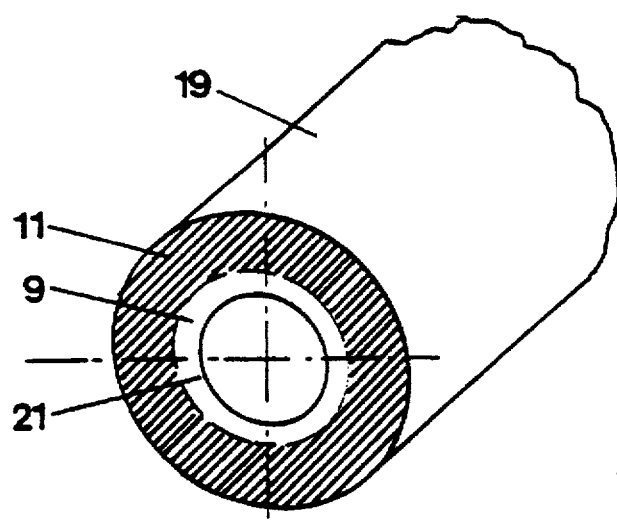
FIG. 4B shows a section of a pipe with a transparent inner layer.
Figure 4C:
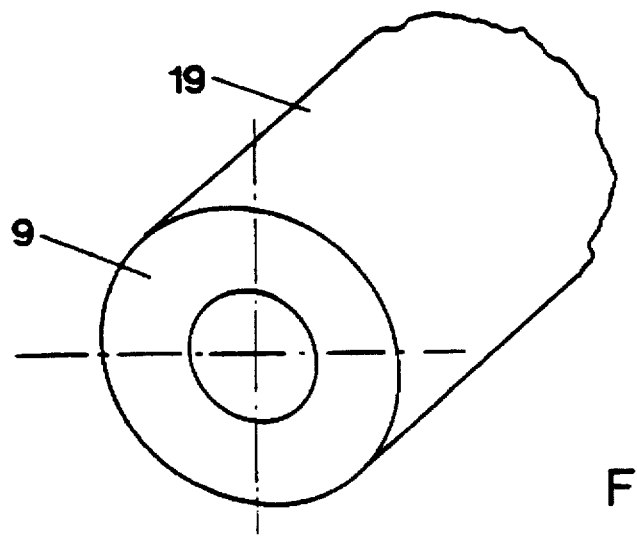

FIGS. 4A, B, and C show simple sections of pipe to demonstrate how easy it is to cast pipes 19 by means of the process according to the invention and then to provide them with a transparent layer 9 in defined areas, e.g., on outer surface 20 or inner surface 21, by means of a heat treatment, an opaque layer of base material 11 remaining on the opposite side in each case. If desired, the entire section of pipe 19 can be vitrified over its entire wall thickness; in this case, the heat treatment according to the invention can proceed from the outside or from the inside or from both sides. Appropriate measures depend on the length of the pipe section, on its diameter, and on the wall thickness of the base.

Figure 5:
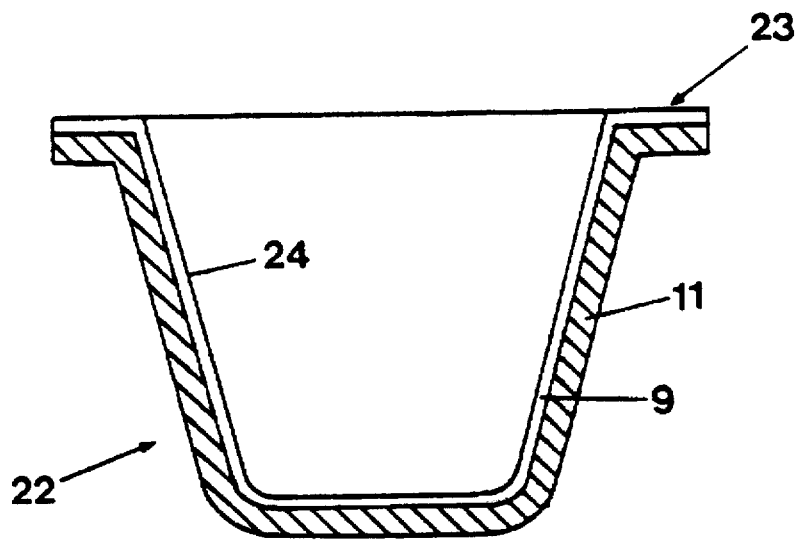
FIG. 5 shows a crucible with a transparent interior layer.

FIG. 5 shows a crucible 22, which has an outward-projection peripheral flange 23 at the top. The crucible is produced as the base by means of the slip casting process according to the invention. As indicated in FIG. 5, interior surface 24 and the upward-facing exterior surface of flange 23 are made transparent; that is, these surface areas were heat-treated to produce a transparent layer 9 with a thickness in the range of 1–2 mm in base material 11 of the base. In this way, the interior surface of the crucible is refined; that is, the pores are closed, and a very smooth surface is produced. It can be seen that crucibles of this kind can be produced very inexpensively, because the step of fusing separate components together to produce the transparent quartz glass interior lining is eliminated. Instead, only a single slip-coat base is required.

Figure 6:
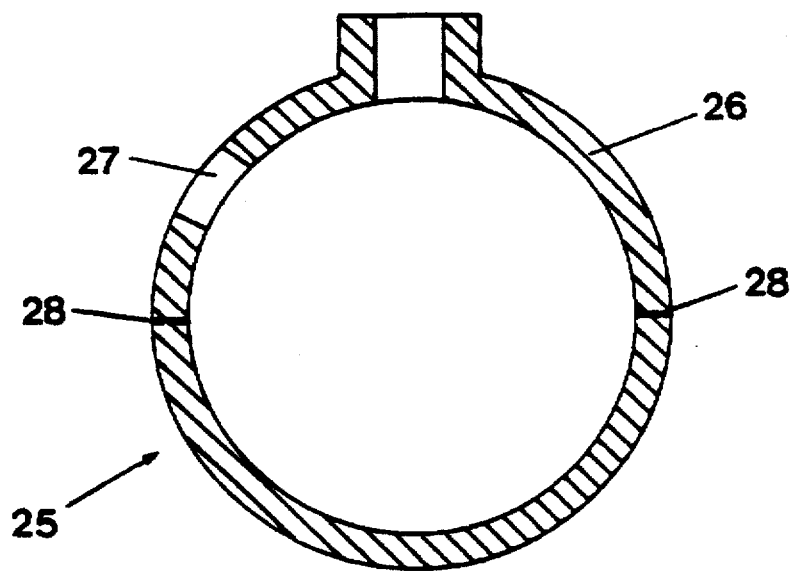
FIG. 6 shows a container with a transparent viewing window.

FIG. 6 shows an embodiment of a closed container 25, which is formed from two halves as components, as indicated by parting line 28. Each of these halves is produced by the slip-casting method. At a certain location on upper half 26, a viewing window 27 is provided, which is produced by the local heat treatment of the opaque base material. On the basis of this embodiment it can be seen that defined areas can be made transparent afterwards, that is, after the two bases have been assembled to form the container. There is no need to take such windows into consideration in advance when constructing such bases; on the contrary, the windows can be adapted to suit the requirements of the customer. Until now, such windows had to be fused into the walls of a container such as this afterwards, which necessitated a very complicated and cost-intensive set of procedures.

We claim:

1. Molded body of quartz glass which has at least one surface region of transparent quartz glass, having an exposed surface with a surface microroughness of less than 8 µm, said body comprising a base consisting of a base material which has a chemical purity of at least 99.9% and a cristobalite content of no more than 1%; which is gas-impermeable and opaque and contains pores; which has, at a wall thickness of 1 mm, a nearly constant direct spectral transmission of less than 10% in the wavelength range of $\lambda=190$ nm to $\lambda=2,650$ nm; and which has a density of at least 2.16 g/cm$^3$; and wherein the transparent surface region is formed from the base material by subjecting the base material to a heat treatment at a temperature above 1,650° C., the transparent layer being at least 0.5 mm thick, the direct spectral transmission of the transparent layer in the wavelength range of λ=600 nm to λ=2,650 nm being at least 60% for a thickness of 1 mm.

2. Molded body according to claim 1, wherein said body consists of a single base.

3. Molded body according to claim 1 wherein at least 80% of the pores of the base material have a maximum pore dimension of less than 20 μm.

4. A molded body according to claim 3 wherein at least 80% of the base material have a maximum pore dimension of less than 10 u.

5. Molded body according to claim 1 wherein the pore content in the base material is in the range of 0.5–2.5% per unit volume.

6. Molded body according to claim 1 wherein the transparent surface region forms the surface of a flange.

7. Molded body according to claim 1 wherein the base is a hollow component having an exterior surface and an interior surface, at least part of one of said surfaces forming the transparent surface region.

8. Molded body according to claim 1 wherein the transparent surface region is transparent over the entire wall thickness of the base.

9. Molded body according to claim 1 wherein the base is designed as a crucible, the entire interior surface of which is transparent up to a wall thickness of at least 1.0 mm.

10. Molded body according to claim 1 wherein the base is a component of a container and wherein the transparent surface region is transparent over the entire wall thickness of the base to form a viewing window.

11. Molded body according to claim 1 wherein the base is designed as a component of a mirror blank, wherein the transparent surface region forms the surface of the mirror blank to be provided with a reflective coating.

12. Molded body according to claim 1 wherein the transparent surface region has a thickness of at least 1.0 mm.

13. Process for the production of a molded body of quartz glass with at least one surface region of transparent quartz glass, the exposed surface of which is smooth, with a microroughness of less than 8 μm, comprising the steps of producing a base by the slip casting method, where quartz glass of a purity of at least 99.9% is ground into a powder with a particle size of less than 70 μm; forming a slip from the powder and stabilizing the slip over the course of 1–240 hours by keeping it in continuous motion; loading the stabilized slip into a porous mold corresponding to the base, where it is allowed to remain for a predetermined period of time; after removal from the mold, drying the base blank and heating it in a furnace at a heating rate of 5–60 K/min to a sintering temperature in the range of 1,350°–1,450° C. and then exposing the blank to a temperature of more than 1,300° C. for a period of at least 40 minutes; cooling the sintered base and then heating a surface region of the opaque, porous, gas-impermeable base material forming the base locally by means of a heat source to a temperature in the range of 1,650°–2,000° C. to transform the porous, opaque base material into transparent quartz glass until the thickness of the transparent surface region is at least 0.5 mm and its direct spectral transmission in the wavelength range of λ=600 nm to λ=2,650 nm has a value of at least 60% for a layer thickness of 1 mm.

14. Process according to claim 13 wherein a gas burner selected from the group consisting of a natural gas or oxyhydrogen-oxygen torch, a plasma torch, an electric arc, and a laser is used as a heat source.

15. A process according to claim 14 wherein the laser is a $CO_2$ laser.

16. Process according to claim 13 wherein the heat source and the surface region are moved relative to each other.

17. Process according to claim 13 wherein the heat source is moved back and forth over the surface region.

18. Process according to claim 13 wherein the base is designed as a hollow component and at least part of its exterior and/or interior surface is heated by means of the heat source.

19. Process according to claim 18 wherein the hollow component is rotated so that partial regions of its exterior and/or interior surface can be heated.

20. Process according to claim 13 wherein the heating of the surface region of the base is continued until the entire wall thickness of the base is transparent.

21. Process according to claim 13 wherein the base is designed as a crucible, the entire interior surface of which is heated by the heat source until a transparent layer with a thickness of at least 1. mm has been produced.

22. Process according to claim 13 wherein the base is designed as a component of a mirror blank and the heat source is moved back and forth over the surface of the mirror blank which is intended to serve as the reflective surface.

* * * * *

UNITED STATES PATENT AND TRADEMARK OFFICE
CERTIFICATE OF CORRECTION

PATENT NO. : 5,736,206
DATED : April 7, 1998
INVENTOR(S) : Englisch et al.

It is certified that error appears in the above-identified patent and that said Letters Patent is hereby corrected as shown below:

On the cover, in the Abstract, line 14, change "$\lambda = 6001\text{-}2{,}650$" to -- $\lambda = 600\text{-}2{,}650$ --.

In column 1, line 55, delete "which".
In column 3, line 58, change "sup-ply" to -- supply --.
In column 5, line 22, change "pro-duce" to -- produce --.
In column 5, line 39, change "!0" to -- 10 --.
In Claim 4, column 7, line 10, after "80%" insert -- of the pores --.
In claim 4, column 7, line 11, after 10, change "u" to -- $\mu$m --.

Signed and Sealed this

Sixth Day of June, 2000

Q. TODD DICKINSON

Attest:

*Attesting Officer*          *Director of Patents and Trademarks*